US012622244B2

(12) United States Patent
Xu et al.

(10) Patent No.: US 12,622,244 B2
(45) Date of Patent: May 5, 2026

(54) METHOD FOR MANUFACTURING SEMICONDUCTOR STRUCTURE WITH DIFFUSION BARRIER LAYERS

(71) Applicant: CHANGXIN MEMORY TECHNOLOGIES, INC., Hefei City (CN)

(72) Inventors: Wentao Xu, Hefei (CN); Lintao Zhang, Hefei (CN); Lei Yang, Hefei (CN); Haoran Li, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 357 days.

(21) Appl. No.: 18/449,047

(22) Filed: Aug. 14, 2023

(65) Prior Publication Data

US 2024/0162085 A1     May 16, 2024

Related U.S. Application Data

(63) Continuation of application No. PCT/CN2023/075976, filed on Feb. 14, 2023.

(30) Foreign Application Priority Data

Nov. 11, 2022    (CN) .......................... 202211414738.3

(51) Int. Cl.
*H10W 20/00*      (2026.01)
*H10W 20/41*      (2026.01)

(52) U.S. Cl.
CPC ....... *H10W 20/039* (2026.01); *H10W 20/038* (2026.01); *H10W 20/0633* (2026.01); *H10W 20/425* (2026.01)

(58) Field of Classification Search
CPC ......... H01L 21/76852; H01L 21/76843; H01L 21/7685; H01L 21/76885; H10W 20/039; H10W 20/0633
See application file for complete search history.

(56) References Cited

U.S. PATENT DOCUMENTS 6,451,691 B2 *   9/2002   Song ................. H01L 21/76843
                                                      438/653
6,541,372 B2 *   4/2003   Wege ................. H01L 21/76852
                                                      257/E21.589
(Continued)

FOREIGN PATENT DOCUMENTS

CN        208738214 U      4/2019
CN        112687643 A      4/2021
(Continued)

OTHER PUBLICATIONS

International Search Report in the international application No. PCT/CN2023/075976, mailed on Jul. 22, 2023. 4 pages.

*Primary Examiner* — Daniel Luke
(74) *Attorney, Agent, or Firm* — Syncoda LLC; Feng Ma

(57) ABSTRACT

A method for manufacturing a semiconductor structure includes: a base provided with a contact hole is provided; an initial contact structure including a first diffusion barrier layer, a conductive layer and a second diffusion barrier layer stacked onto one another is formed on the base, the first diffusion barrier layer conformably covering the contact hole and covering part of a top surface of the base, the conductive layer covering first diffusion barrier layer and being filled in unoccupied space in the contact hole, the second diffusion barrier layer covering a side of the conductive layer away from first diffusion barrier layer, the initial contact structure outside the contact hole being provided with a groove exposing side walls of conductive layer and second diffusion barrier layer; a third diffusion barrier (Continued)

layer is formed on a side wall of initial contact structure exposed by the groove to obtain a target contact structure.

8 Claims, 11 Drawing Sheets

(56)                    References Cited

U.S. PATENT DOCUMENTS

| | | | | |
|---|---|---|---|---|
| 6,544,871 | B1 * | 4/2003 | Honeycutt | ........ H01L 21/76885 |
| | | | | 438/785 |
| 7,772,110 | B2 | 8/2010 | Robison | |
| 9,224,643 | B2 * | 12/2015 | Lee | ................... H01L 23/53238 |
| 11,031,325 | B2 | 6/2021 | Shen | |
| 11,670,573 | B2 | 6/2023 | Shen | |
| 2014/0273437 | A1 * | 9/2014 | Fuller | .............. H01L 21/32139 |
| | | | | 438/653 |
| 2021/0118783 | A1 | 4/2021 | Shen | |
| 2021/0287973 | A1 | 9/2021 | Shen | |

FOREIGN PATENT DOCUMENTS

| | | | |
|---|---|---|---|
| CN | 113035797 | A | 6/2021 |
| CN | 114093807 | A | 2/2022 |
| KR | 19990025084 | A | 4/1999 |
| KR | 20080055309 | A | 6/2008 |
| KR | 20080057799 | A | 6/2008 |

* cited by examiner

METHOD FOR MANUFACTURING SEMICONDUCTOR STRUCTURE WITH DIFFUSION BARRIER LAYERS

CROSS-REFERENCE TO RELATED APPLICATIONS

This disclosure is a continuation application of International Patent Application No. PCT/CN2023/075976, filed on Feb. 14, 2023, which is based upon and claims the priority to Chinese Patent Application No. 202211414738.3, filed on Nov. 11, 2022, and entitled "SEMICONDUCTOR STRUCTURE AND METHOD FOR MANUFACTURING SEMICONDUCTOR STRUCTURE". The contents of International Patent Application No. PCT/CN2023/075976 and Chinese Patent Application No. 202211414738.3 are incorporated herein by reference in their entireties.

BACKGROUND

With an improvement of requirements for an integrated density of a semiconductor structure, a critical dimension of the semiconductor structure is gradually reduced. On the one hand, requirements for a precision for the patterning of the semiconductor structure are higher, and on the other hand, a spacing between adjacent conductive structures is continuously reduced. The above factors lead to the problem of a short circuit between the adjacent conductive structures in a manufacturing process.

SUMMARY

Embodiments of the disclosure relate to the technical field of semiconductors, and in particular to a semiconductor structure and a method for manufacturing a semiconductor structure.

Embodiments of the disclosure provide a semiconductor structure and a method for manufacturing a semiconductor structure.

According to some embodiments of the disclosure, an aspect of the embodiments of the disclosure provides a method for manufacturing a semiconductor structure. The method includes the following operations. A base is provided. The base is provided with a contact hole. An initial contact structure, and a first groove located on at least one side of the initial contact structure are formed on the base. The initial contact structure includes a first diffusion barrier layer, a conductive layer and a second diffusion barrier layer stacked onto one another. The first diffusion barrier layer conformably covers the contact hole, and the first diffusion barrier layer covers a part of a top surface of the base. The conductive layer covers the first diffusion barrier layer, and is filled in the contact hole. The second diffusion barrier layer covers a top surface of the conductive layer. The first groove exposes a side wall of the initial contact structure. A third diffusion barrier layer is formed on the side wall of the initial contact structure to obtain a target contact structure.

According to some embodiments of the disclosure, another aspect of the embodiments of the disclosure provides a semiconductor structure. The semiconductor structure includes a base, and at least one target contact structure located on the base. The base is provided with a contact hole. The at least one target contact structure includes a first diffusion barrier layer, a conductive layer, a second diffusion barrier layer and a third diffusion barrier layer. The first diffusion barrier layer conformably covers the contact hole, and the first diffusion barrier layer covers a part of a top surface of the base. The conductive layer covers the first diffusion barrier layer, and is filled in the contact hole. The second diffusion barrier layer covers a top surface of the conductive layer. The third diffusion barrier layer covers a side wall of the first diffusion barrier layer located outside the contact hole, a side wall of the conductive layer located outside the contact hole, and a side wall of the second diffusion barrier layer located outside the contact hole.

BRIEF DESCRIPTION OF THE DRAWINGS

One or more embodiments are exemplary illustrated by the figures in the drawings corresponding to each of the embodiments, and these exemplary illustrations do not constitute a limitation to the embodiments. Elements having the same reference symbols in the drawings represent similar elements, and the figures in the drawings do not constitute a limitation to a scale unless otherwise stated. In order to more clearly illustrate the technical solution in the embodiments of the disclosure or in the related art, the drawings used in the embodiments will be briefly described below. It will be apparent that the drawings described below are only some embodiments of the disclosure, and for those skilled in the art, other drawings may be obtained according to these drawings without creative labor.

DETAILED DESCRIPTION

Figure 1:
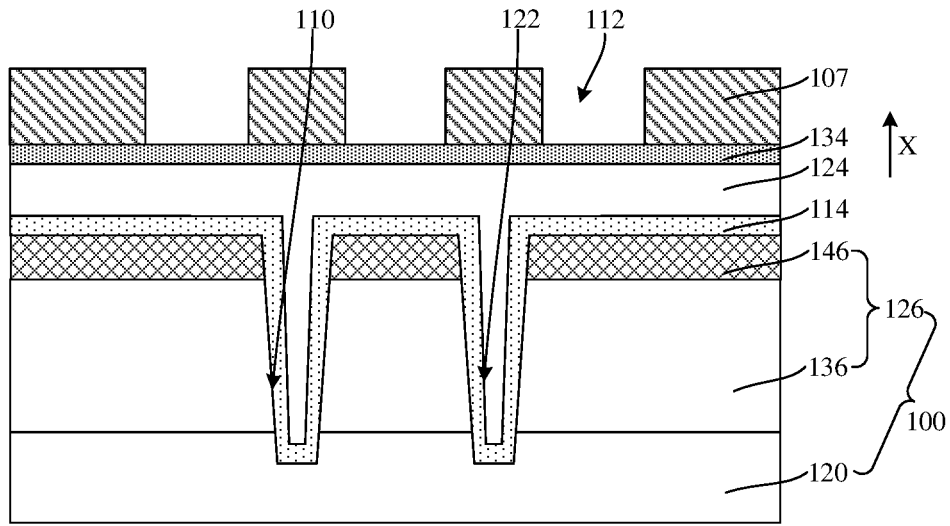
FIG. 1 to FIG. 11 are schematic partial cross-sectional diagrams corresponding to operations of a method for manufacturing a semiconductor structure according to an embodiment of the disclosure.

Embodiments of the disclosure provide a semiconductor structure and a method for manufacturing a semiconductor structure. In the method for manufacturing the semiconductor structure, a direction from a base to a target contact structure is a first direction. Herein, a groove exposes a side wall, extending along the first direction, of an initial contact structure located outside a contact hole, and a third diffusion barrier layer is located on the side wall of the initial contact structure. In this way, a first diffusion barrier layer is arranged between a conductive layer and the base, a second diffusion barrier layer is capped on a top surface of the conductive layer which is away from the first diffusion barrier layer, and the third diffusion barrier layer is arranged on a side wall, extending along the first direction, of the conductive layer located outside the contact hole. That is, a diffusion barrier layer composed of the first diffusion barrier layer, the second diffusion barrier layer and the third diffusion barrier layer wraps an exposed surface of the conductive layer, which is beneficial to avoid or reduce the diffusion of conductive elements in the conductive layer to other film layers, which is beneficial to ensure that the conductive layer has good electrical properties, which is beneficial to improve the electrical properties of the target contact structure, and which is beneficial to reduce the electrical interference between different target contact structures, for example, to avoid or reduce the problem of a short circuit between adjacent conductive layers. In addition, the third diffusion barrier layer is also located on a side wall of the first diffusion barrier layer which extends along the first direction, and a side wall of the second diffusion barrier layer which extends along the first direction. In this way, the third diffusion barrier layer is in contact with and connected with the first diffusion barrier layer and the second diffusion barrier layer while covering the side wall of the conductive layer, which is beneficial to realize the all-round wrapping effect on the conductive layer by the diffusion barrier layer composed of the first diffusion barrier layer, the second diffusion barrier layer and the third diffusion barrier layer, to further avoid or reduce the diffusion of the conductive elements in the conductive layer.

Embodiments of the disclosure will be described in detail below in combination with the drawings. However, those skilled in the art will appreciate that many technical details are presented in the various embodiments of the disclosure, in order to enable the reader to better understand the embodiments of the disclosure. However, even without these technical details and various variations and modifications based on the following various embodiments, the technical solutions claimed by the embodiments of the disclosure may be realized.

An embodiment of the disclosure provides a method for manufacturing a semiconductor structure. The method for manufacturing the semiconductor structure according to an embodiment of the disclosure will be described in detail below in combination with the drawings. FIG. 1 to FIG. 11 are schematic partial cross-sectional diagrams corresponding to operations of a method for manufacturing a semiconductor structure according to an embodiment of the disclosure.

Referring to FIG. 1 to FIG. 11, the method for manufacturing the semiconductor structure includes the following operations. A base 100 is provided. The base 100 is provided with a contact hole 110. An initial contact structure 101, and a first groove 102 located on at least one side of the initial contact structure 101 are formed on the base 100. The initial contact structure 101 includes a first diffusion barrier layer 111, a conductive layer 121 and a second diffusion barrier layer 131 stacked onto one another. The first diffusion barrier layer 111 conformably covers the contact hole 110, and the first diffusion barrier layer 111 covers a part of a top surface of the base 100. The conductive layer 121 covers the first diffusion barrier layer 111, and is filled in an unoccupied space in the contact hole 110. The second diffusion barrier layer 131 covers a top surface of the conductive layer 121. The first groove 102 exposes to a side wall of the initial contact structure 101. The initial contact structure 101 located outside the contact hole 110 is provided with the first groove 102 exposing a side wall of the conductive layer 121 and a side wall of the second diffusion barrier layer 131. A third diffusion barrier layer 141 is formed on a side wall a of the initial contact structure 101 to obtain a target contact structure 151.

In some embodiments, the top surface of the conductive layer 121 is a side of the conductive layer 121 which is away from the first diffusion barrier layer 111. The first groove 102 exposes the side wall of the initial contact structure 101. That is, the first groove 102 exposes the side wall of the conductive layer 121 and the side wall of the second diffusion barrier layer 131.

It can be understood that a direction from the base 100 to the target contact structure 151 is a first direction X. The formed first diffusion barrier layer 111 is located between the conductive layer 121 and the base 100. The formed second diffusion barrier layer 131 covers the top surface of the conductive layer 121 which is away from the base 100. The formed third diffusion barrier layer 141 covers side walls of the first diffusion barrier layer 111, of the conductive layer 121, and of the second diffusion barrier layer 131, which are arranged along the first direction X, and which are exposed by the first groove 102. The first groove 102 is intended to separate different target contact structures 151 from each other. In this way, the different target contact structures 151 may be intended to achieve electrical connections with other different conductive structures.

It should be noted that FIG. 1 to FIG. 11 are only a schematic cross-sectional diagram of the target contact structure 151 of the semiconductor structure taken along a certain direction. The method for manufacturing the semiconductor structure according to an embodiment of the disclosure does not limit a cross-sectional shape of the finally formed target contact structure 151 taken along other directions, as long as the target contact structure 151 is provided with at least one first groove 102.

Herein, a diffusion barrier layer composed of the first diffusion barrier layer 111, the second diffusion barrier layer 131 and the third diffusion barrier layer 141 wraps a surface of the conductive layer 121 which is exposed by the first groove 102, which is beneficial to avoid or reduce the diffusion of conductive elements in the conductive layer 121 to other film layers, which is beneficial to ensure that the conductive layer 121 has good electrical properties, which is beneficial to improve the electrical properties of the target contact structure 151, and which is beneficial to reduce the electrical interference between the different target contact structures 151, for example, to avoid or reduce the problem of a short circuit between adjacent conductive layers 121. In addition, the third diffusion barrier layer 141 is also located on the side wall of the first diffusion barrier layer 111 which extends along the first direction X, and the side wall of the second diffusion barrier layer 131 which extends along the first direction X. In this way, the third diffusion barrier layer 141 is in contact with and connected with the first diffusion barrier layer 111 and the second diffusion barrier layer 131 while covering the side wall of the conductive layer 121, which is beneficial to realize the all-round wrapping effect on the conductive layer 121 by the diffusion barrier layer composed of the first diffusion barrier layer 111, the second diffusion barrier layer 131 and the third diffusion barrier layer 141, to further avoid or reduce the diffusion of the conductive elements in the conductive layer 121.

The method for manufacturing the semiconductor structure according to an embodiment of the disclosure will be described in more detail below in combination with the drawings.

In some embodiments, the base 100 includes a substrate 120, and a second dielectric layer 126 located on the substrate 120. The contact hole 110 is located in the second dielectric layer 126.

In some embodiments, referring to FIG. 1, the second dielectric layer 126 may include a third dielectric layer 136 and a fourth dielectric layer 146 stacked onto one another along the first direction X. Herein, a material of the third dielectric layer 136 may be silicon oxide, and a material of the fourth dielectric layer 146 may be silicon nitride. The fourth dielectric layer 146 may serve as an etch stop layer for the second diffusion barrier layer 131 which is subsequently formed. In the practical application, the second dielectric layer 126 may also be a single film layer structure, or a multi-film layer structure with more than two layers.

Figure 2:
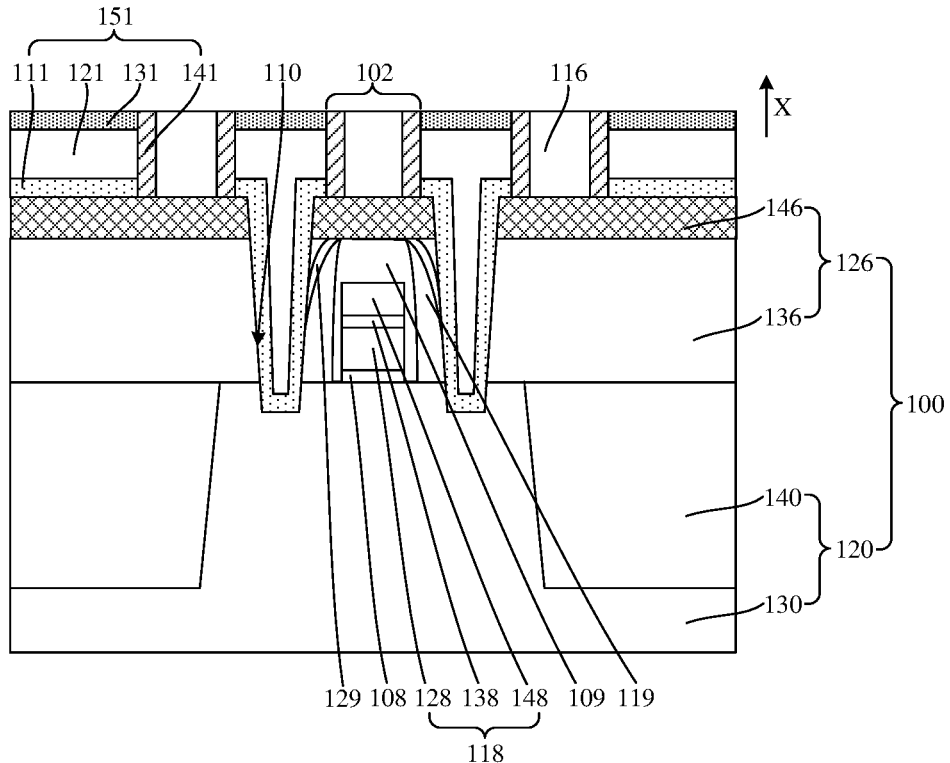

In some embodiments, referring to FIG. 2, the substrate 120 may include multiple active areas 130, and a shallow trench isolation structure 140 located between any adjacent active areas 130 of the multiple active areas 130. It should be noted that FIG. 2 only illustrates a schematic partial cross-sectional diagram of the base 100, and the substrate 120 and the second dielectric layer 126 will be described in detail below according to FIG. 2.

In some embodiments, the operation that the initial contact structure 101, and the first groove 102 located on the at least one side of the initial contact structure 101 are formed on the base 100 includes the following operations.

Referring to FIG. 1, a first diffusion barrier material layer 114, a conductive material layer 124 and a second diffusion barrier material layer 134 stacked onto one another are formed on the base 100. The first diffusion barrier material layer 114 conformably covers the contact hole 110, and the first diffusion barrier material layer 114 covers the top surface of the base 100. The conductive material layer 124 covers the first diffusion barrier material layer 114, and is filled in the contact hole 110. The second diffusion barrier material layer 134 covers the conductive material layer 124.

It can be understood that the first diffusion barrier material layer 114 is an initial film layer for subsequently forming the first diffusion barrier layer 111, the conductive material layer 124 is an initial film layer for subsequently forming the conductive layer 121, and the second diffusion barrier material layer 134 is an initial film layer for subsequently forming the second diffusion barrier layer 131.

In some embodiments, referring to FIG. 1, the first diffusion barrier material layer 114 conformably covers the contact hole 110, and the first diffusion barrier material layer 114 covers the top surface of the base 100. That is, the first diffusion barrier material layer 114 covers a surface of the substrate 120 which is exposed by the contact hole 110, the first diffusion barrier material layer 114 covers a surface of the second dielectric layer 126 which is exposed by the contact hole 110, and the first diffusion barrier material layer 114 covers a side of the second dielectric layer 126 which is away from the substrate 120. The first diffusion barrier material layer 114 located in the contact hole 110 defines a pore 122. The conductive material layer 124 is located on a surface of the first diffusion barrier material layer 114 which is away from the second dielectric layer 126, and the pore 122 is filled with the conductive material layer 124.

It should be noted that in FIG. 1, as an example, a portion of the first diffusion barrier material layer 114 and a portion of the conductive material layer 124 are embedded in the substrate 120. In other embodiments, only a portion of the first diffusion barrier material layer 114 may be embedded in the substrate 120. In still other embodiments, neither the first diffusion barrier material layer 114 nor the conductive material layer 124 is embedded in the substrate 120, and the first diffusion barrier material layer 114 is in contact with and connected with a surface of the substrate 120.

Figure 3:
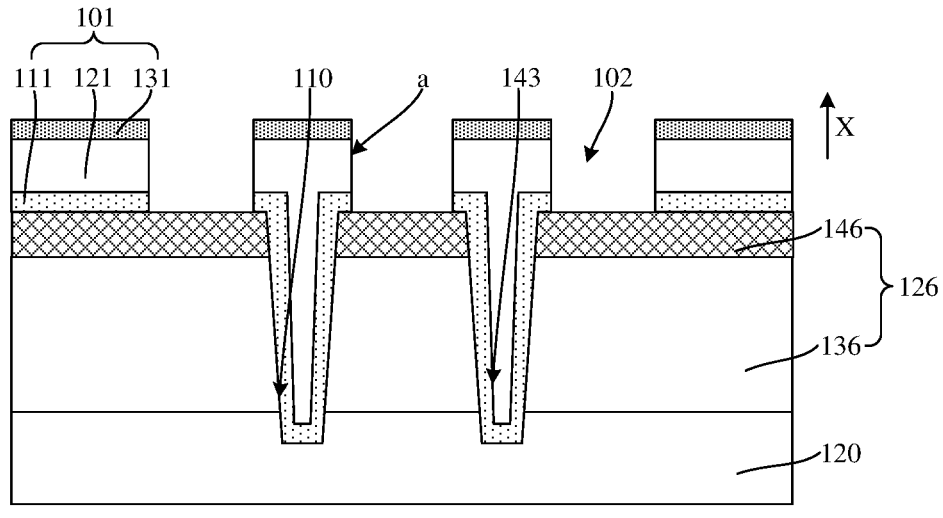

Referring to FIG. 1 and FIG. 3, the first diffusion barrier material layer 114, the conductive material layer 124 and the second diffusion barrier material layer 134 are patterned to form the initial contact structure 101, and the first groove 102 exposing the side wall a of the initial contact structure 101.

In some embodiments, the operation that the first diffusion barrier material layer 114, the conductive material layer 124 and the second diffusion barrier material layer 134 are patterned includes the following operations.

Referring to FIG. 1, a mask layer 107 is formed on a side of the second diffusion barrier material layer 134 which is away from the conductive layer 121. The mask layer 107 is provided with at least one opening 112 exposing the second diffusion barrier material layer 134. Herein, the opening 112 is directly aligned with the subsequently formed first groove 102 (see FIG. 3). That is, an orthographic projection of the opening 112 on the base 100 coincides with an orthographic projection of the first groove 102 on the base 100.

It should be noted that the method for manufacturing the semiconductor structure according to an embodiment of the disclosure does not limit a specific process for forming the mask layer 107 provided with the opening 112. For example, the mask layer 107 may be formed by self-aligned double patterning (SADP) or self-aligned quadruple patterning (SAQP).

Referring to FIG. 1 and FIG. 3, the second diffusion barrier material layer 134, the conductive material layer 124 and the first diffusion barrier material layer 114 are etched sequentially by using the mask layer 107 as a mask, to form the initial contact structure 101 provided with the first groove 102. In this way, a remaining portion of the conductive material layer 124 serves as the conductive layer 121. A remaining portion of the first diffusion barrier material layer 114 serves as the first diffusion barrier layer 111, and the first diffusion barrier layer 111 is located between the conductive layer 121 and the base 100, to prevent the conductive elements in the conductive layer 121 from diffusing into the base 100, and to prevent the conductive layer 121 and the base 100 from being subjected to the undesirable electrical interference. A remaining portion of the second diffusion barrier material layer 134 serves as the second diffusion barrier layer 131, and the second diffusion barrier layer 131 covers the top surface of the conductive layer 121 which is away from the base 100, to prevent the conductive elements in the conductive layer 121 from diffusing outward from the top surface of the conductive layer 121.

In some embodiments, the structure that the first diffusion barrier layer 111 conformably covers the contact hole 110, and a part of the first diffusion barrier layer 111 covers a part of the top surface of the base 100 refers to the following structure. The first diffusion barrier layer 111 is located on a surface of the substrate 120 which is exposed by the contact hole 110, the first diffusion barrier layer 111 is located on a surface of the second dielectric layer 126 which is exposed by the contact hole 110, and the first diffusion barrier layer 111 is located on a part of a surface of the second dielectric layer 126 which is away from the substrate 120. The first diffusion barrier layer 111 located in the contact hole 110 defines a pore 122. The conductive layer 121 is located on a surface of the first diffusion barrier layer 111 which is away from the second dielectric layer 126, and the pore 122 is filled with the conductive material layer 124.

It should be noted that in FIG. 3, as an example, a portion of the first diffusion barrier layer 111 and a portion of the conductive layer 121 are embedded in the substrate 120. In other embodiments, only a portion of the first diffusion barrier layer 111 may be embedded in the substrate 120. In still other embodiments, neither the first diffusion barrier layer 111 nor the conductive layer 121 is embedded in the substrate 120, and the first diffusion barrier layer 111 is in contact with and connected with a surface of the substrate 120.

In some embodiments, the operation that the third diffusion barrier layer 141 is formed on the side wall of the initial contact structure 101 includes the following operations.

Figure 4:
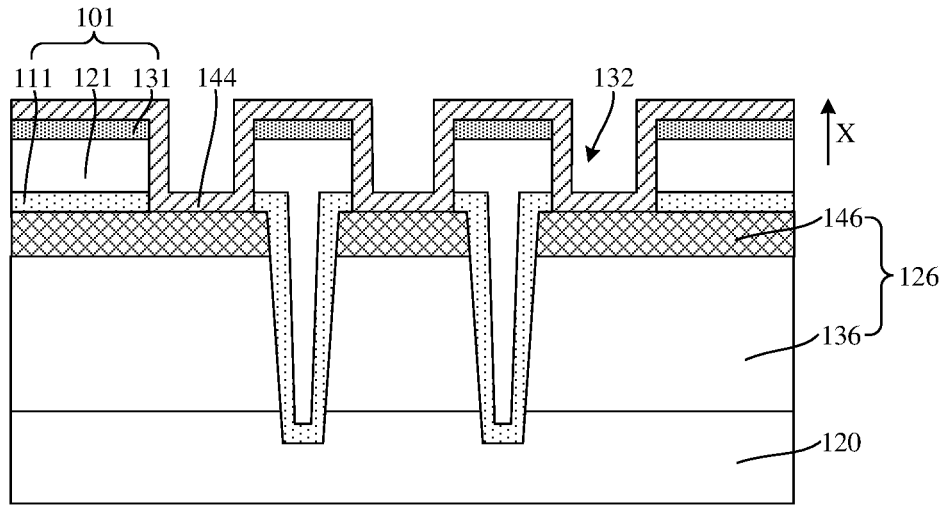

Referring to FIG. 3 and FIG. 4, a third diffusion barrier material layer 144 is formed. The third diffusion barrier material layer 144 conformably covers the first groove 102, and the third diffusion barrier material layer 144 covers a top surface of the initial contact structure 101 which is away from the base 100. Herein, the third diffusion barrier material layer 144 located in the first groove 102 defines a second groove 132. The structure that the third diffusion barrier material layer 144 conformably covers the first groove 102 refers to the following structure. The third diffusion barrier material layer 144 is located on a bottom surface and a side surface of the first groove 102.

Figure 5:
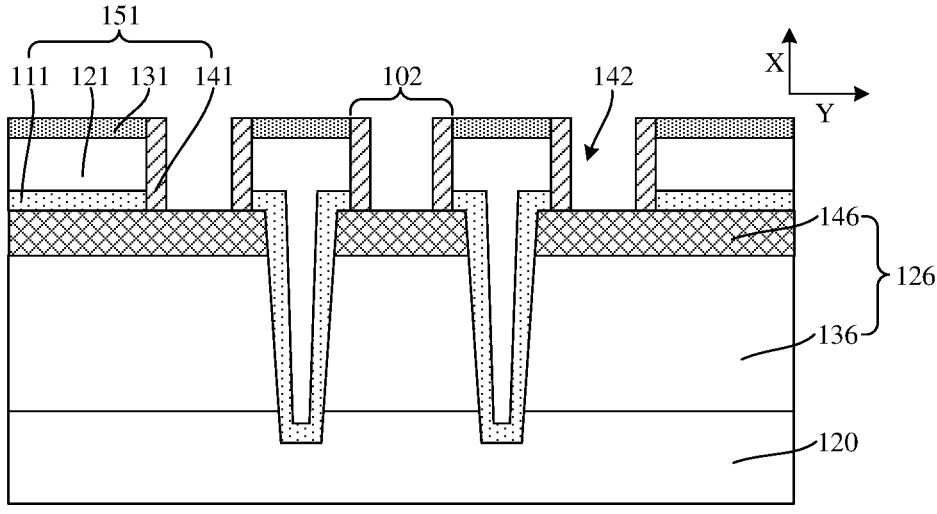

Referring to FIG. 4 and FIG. 5, the third diffusion barrier material layer 144 is etched back to form the third diffusion barrier layer 141 located on the side wall a (referring to FIG. 3) of the initial contact structure 101.

In some embodiments, the third diffusion barrier material layer 144 is etched by using the second dielectric layer 126 exposed by the first groove 102 as an etch stop layer, to form the third diffusion barrier layer 141. In some embodiments, the third diffusion barrier material layer 144 is etched by a dry etching process, and when the second dielectric layer 126 is exposed, the third diffusion barrier material layer 144 forming a bottom surface of the second groove 132 is removed to form a third groove 142.

In some embodiments, a thickness of the second diffusion barrier material layer 134 is greater than a thickness of the third diffusion barrier material layer 144. It can be understood that the thickness of the second diffusion barrier material layer 134 corresponds to a thickness of the second diffusion barrier layer 131 in the first direction X. The thickness of the third diffusion barrier material layer 144 refers to a thickness in the first direction X of the third diffusion barrier material layer 144 located on a top surface of the second diffusion barrier layer 131 which is away from the conductive layer 121.

In some embodiments, the thickness in the first direction X of the third diffusion barrier material layer 144 located on the top surface of the second diffusion barrier layer 131 which is away from the conductive layer 121, a thickness in the first direction X of the third diffusion barrier material layer 144 forming the bottom surface of the second groove 132, and a thickness in a second direction Y of the third diffusion barrier material layer 144 located on the side wall a of the initial contact structure 101 have the same numerical range. Herein, the second direction Y is a direction from the conductive layer 121 to the third diffusion barrier layer 141.

In this way, in the operation that the third diffusion barrier material layer 144 is etched back by using the second dielectric layer 126 as the etch stop layer, in order to ensure that the third diffusion barrier material layer 144 forming the bottom surface of the second groove 132 is completely removed, the third diffusion barrier material layer 144 may be over etched. In this case, after the third diffusion barrier material layer 144 located on the top surface of the second diffusion barrier layer 131 which is away from the conductive layer 121 is completely removed, a portion of the exposed second diffusion barrier layer 131 is also removed. Therefore, the fact that the thickness of the second diffusion barrier material layer 134 is greater than the thickness of the third diffusion barrier material layer 144 is beneficial to ensure that a remaining portion of the second diffusion barrier layer 131 has a sufficient thickness in the first direction X after the third diffusion barrier layer 141 is formed, to ensure a better blocking effect on the conductive elements in the conductive layer 121. Certainly, in the practical application, the thickness of the second diffusion barrier material layer 134 may be less than or equal to the thickness of the third diffusion barrier material layer 144, as long as the remaining portion of the second diffusion barrier layer 131 still has a sufficient thickness in the first direction X after the third diffusion barrier material layer 144 is over etched.

In the practical application, the process parameters for the formation of the third diffusion barrier material layer 144 may be controlled, such that the thickness of the third diffusion barrier material layer 144 forming the bottom surface of the second groove 132 is less than the thickness of the third diffusion barrier material layer 144 located on the top surface of the second diffusion barrier layer 131. In this way, in the operation that the third diffusion barrier material layer 144 is etched, when the third diffusion barrier material layer 144 forming the bottom surface of the second groove 132 is removed, a remaining portion of the third diffusion barrier material layer 144 is located not only on the side wall a of the initial contact structure 101, but also on the top surface of the second diffusion barrier layer 131 which is away from the conductive layer 121.

Figure 6:
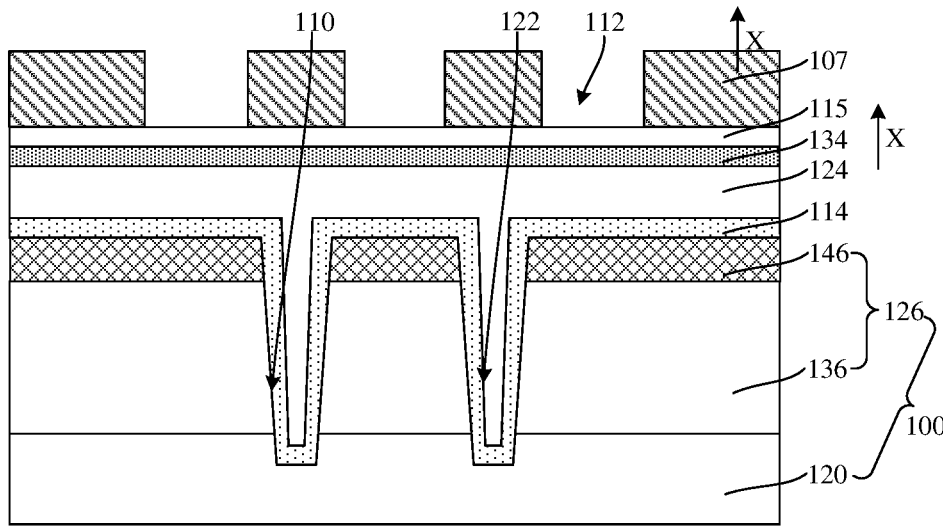
Figure 7:
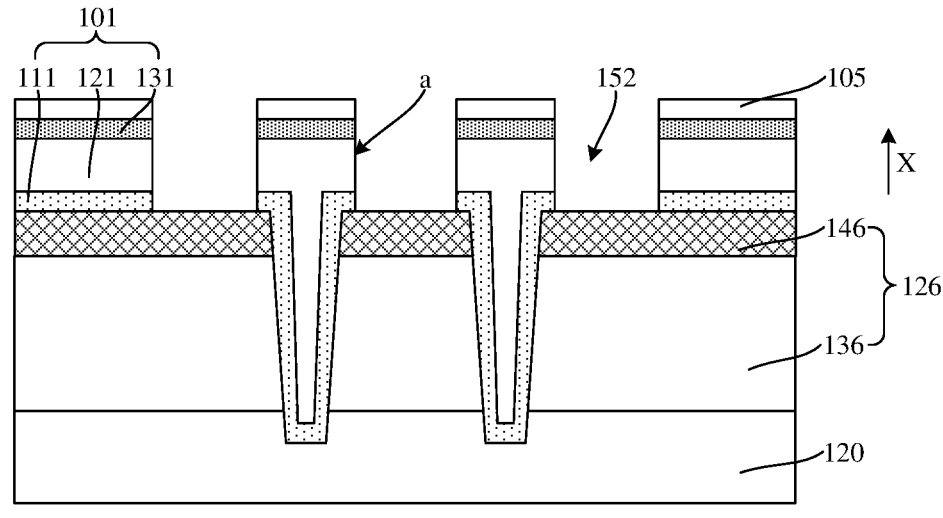

In some embodiments, referring to FIG. 6 and FIG. 7, the method for manufacturing the semiconductor structure may further include the following operation. A sacrificial layer 105 is formed on a top surface of the initial contact structure 101. The top surface of the initial contact structure 101 is a surface of the initial contact structure 101 which is away from the base 100.

In some embodiments, the operation that the initial contact structure 101, the first groove 102 located on at least one side of the initial contact structure 101, and the sacrificial layer 105 are formed includes the following operations.

Referring to FIG. 6, a first diffusion barrier material layer 114, a conductive material layer 124, a second diffusion barrier material layer 134 and a sacrificial material layer 115 stacked onto one another are formed on the base 100. The first diffusion barrier material layer 114 conformably covers the contact hole 110, and the first diffusion barrier material layer 114 covers the top surface of the base 100. The conductive material layer 124 covers the first diffusion barrier material layer 114, and is filled in an unoccupied space in the contact hole 110. The second diffusion barrier material layer 134 covers the conductive material layer 124. The sacrificial material layer 115 covers the second diffusion barrier material layer 134.

It should be noted that the operation that the first diffusion barrier material layer 114, the conductive material layer 124 and the second diffusion barrier material layer 134 stacked onto one another are formed on the base 100 is the same as the operation in the embodiment described above, and will not be repeated herein.

In some embodiments, a material of the sacrificial material layer 115 is silicon nitride.

Referring to FIG. 6 and FIG. 7, the first diffusion barrier material layer 114, the conductive material layer 124, the second diffusion barrier material layer 134 and the sacrificial material layer 115 are patterned to form the initial contact structure 101, the sacrificial layer 105, and an initial groove 152, where the initial groove 152 exposes a side wall a of the initial contact structure 101 and a side wall of the sacrificial layer 105. The initial groove 152 includes the first groove 102 (referring to FIG. 3).

In some embodiments, the sacrificial material layer 115 is patterned by using the mask layer 107 as a mask, to form the sacrificial layer 105. It should be noted that the operation that the first diffusion barrier material layer 114, the conductive material layer 124 and the second diffusion barrier material layer 134 are patterned is the same as the operation in the embodiment described above, and will not be repeated herein.

In some embodiments, referring to FIG. 7 to FIG. 11, the operation that the third diffusion barrier layer 141 is formed on the side wall a of the initial contact structure 101 includes the following operations.

Figure 8:
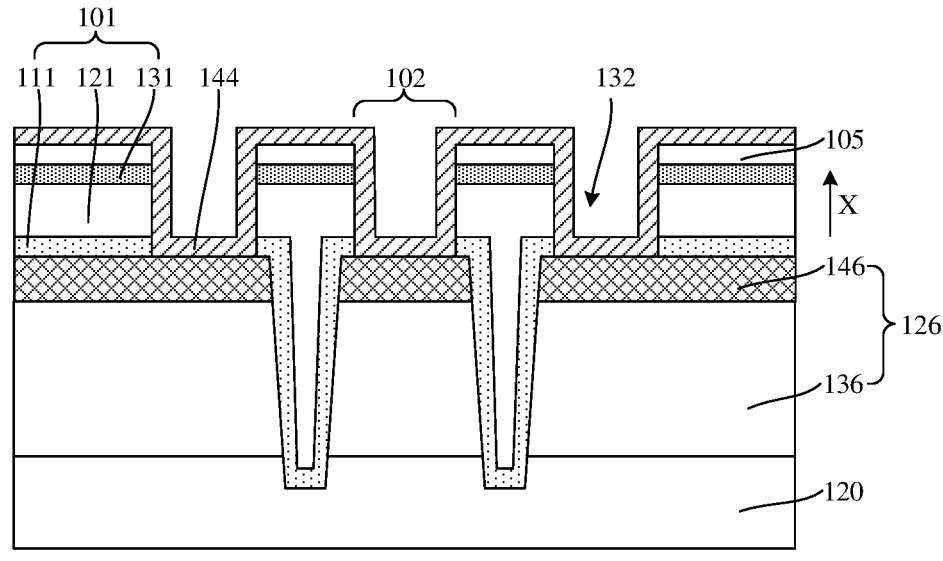

Referring to FIG. 7 and FIG. 8, a third diffusion barrier material layer 144 is formed. The third diffusion barrier material layer 144 conformably covers the initial groove 152, and the third diffusion barrier material layer 144 covers a top surface of the sacrificial layer 105. Herein, the third diffusion barrier material layer 144 located in the initial groove 152 defines a second groove 132. The structure that the third diffusion barrier material layer 144 conformally covers the initial groove 152 refers to the following structure. The third diffusion barrier material layer 144 is located on a bottom surface and a side surface of the initial groove 152. Herein, the third diffusion barrier material layer 144 is located not only on the side wall of the initial contact structure 101, but also on the side wall of the sacrificial layer 105 which extends along the first direction X, and on the top surface of the base 100 which is exposed by the initial groove 152.

In some embodiments, the top surface of the sacrificial layer 105 is a surface of the sacrificial layer 105 which is away from the base 100.

Figure 9:
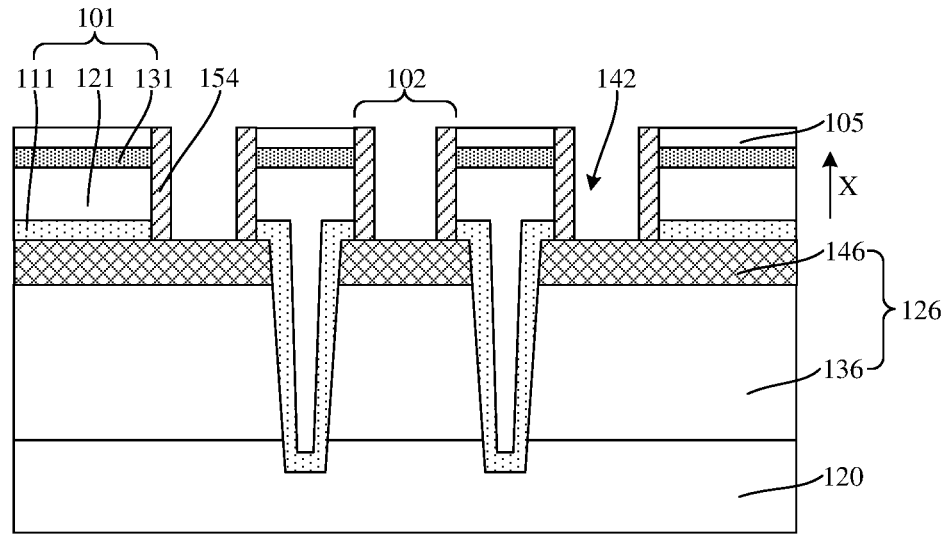

Referring to FIG. 8 and FIG. 9, the third diffusion barrier material layer 144 is etched back to form a third initial diffusion barrier layer 154 located on the side wall a of the initial contact structure 101 and the side wall of the sacrificial layer 105.

In some embodiments, the third diffusion barrier material layer 144 is etched by using the sacrificial layer 105 as an etch stop layer, to form the third initial diffusion barrier layer 154 and expose a part of the top surface of the base 100.

In some embodiments, a thickness of the second diffusion barrier material layer 134 is equal to a thickness of the third diffusion barrier material layer 144. It can be understood that the thickness of the second diffusion barrier material layer 134 corresponds to a thickness of the second diffusion barrier layer 131 in the first direction X. The thickness of the third diffusion barrier material layer 144 refers to a thickness in the first direction X of the third diffusion barrier material layer 144 located on a top surface of the second diffusion barrier layer 131 which is away from the conductive layer 121.

In some embodiments, the thickness in the first direction X of the third diffusion barrier material layer 144 located on the top surface of the second diffusion barrier layer 131 which is away from the conductive layer 121, a thickness in the first direction X of the third diffusion barrier material layer 144 forming a bottom surface of the second groove 132, and a thickness in a second direction Y of the third diffusion barrier material layer 144 located on the side wall a of the initial contact structure 101 have the same numerical range. Herein, the second direction Y is a direction from the conductive layer 121 to the third diffusion barrier layer 141.

In this way, in the operation that the third diffusion barrier material layer 144 is etched back by using the sacrificial layer 105 as the etch stop layer, when the third diffusion barrier material layer 144 located on the top surface of the second diffusion barrier layer 131 which is away from the conductive layer 121 is removed, the third diffusion barrier material layer 144 forming the bottom surface of the second groove 132 is also removed to form a third groove 142. In addition, the second diffusion barrier layer 131 is not etched when the sacrificial layer 105 is capped on the second diffusion barrier layer 131. Therefore, the thickness of the second diffusion barrier material layer 134 may be equal to the thickness of the third diffusion barrier material layer 144.

It can be understood that in a case that a thickness of the sacrificial material layer 115 is too small, when the third diffusion barrier material layer 144 is subsequently etched by using the sacrificial layer 105 as the etch stop layer to form the third initial diffusion barrier layer 154, it is easy to cause over etching on the top surface of the second diffusion barrier layer 131, which affects the wrapping effect of the second diffusion barrier layer 131 on the conductive layer

121. In a case that the thickness of the sacrificial material layer 115 is too large, it is not beneficial to the subsequent removal of the sacrificial layer 105 and the subsequent removal of the third diffusion barrier material layer 144 located on the side wall of the sacrificial layer 105 which extends along the first direction X. For example, the thickness of the sacrificial layer 115 is too large, which increases the time required for the subsequent removal of the sacrificial layer 105 and the cost required for the removal of the sacrificial layer 105. In this way, in the practical application, the sacrificial material layer 115 with a moderate thickness may be provided according to the specific requirements, which is beneficial to avoid subsequent over etching of the second diffusion barrier layer 131 and reduce the time and cost required for the subsequent removal of the sacrificial layer 105 and the subsequent removal of the third diffusion barrier material layer 144 located on the side wall of the sacrificial layer 105 which extends along the first direction X.

In the above various embodiments, a process for the formation of the second diffusion barrier material layer 134 is different from a process for the formation of the third diffusion barrier material layer 144. The process for the formation of the third diffusion barrier material layer 144 includes a low pressure chemical vapor deposition process or a plasma enhanced chemical vapor deposition process.

It can be understood that in the operation that the third diffusion barrier material layer 144 is formed, a main purpose thereof is to form the third diffusion barrier material layer 144 on the side wall a of the initial contact structure 101 which extends along the first direction X, which may be understood to mean that the third diffusion barrier material layer 144 is formed in the second direction Y. A low pressure chemical vapor deposition process (LPCVD) or a plasma enhanced chemical vapor deposition process (PECVD) facilitates the formation of the third diffusion barrier material layer 144 with a desired thickness on the side wall a of the initial contact structure 101 which extends along the first direction X, to finally form the third diffusion barrier layer 141 that meets the desired requirements.

In addition, in the operation that the second diffusion barrier material layer 134 is formed, a main purpose thereof is to form the second diffusion barrier material layer 134 on the top surface of the conductive layer 121 which is away from the base 100, which may be understood to mean that the second diffusion barrier material layer 134 is formed in the first direction X. The second diffusion barrier material layer 134 is formed in the first direction X by using a chemical vapor deposition method or a physical vapor deposition (PVD) method. In this way, it is beneficial to reduce the total preparation cost required for the formation of the second diffusion barrier layer 131 and the third diffusion barrier layer 141 while forming the second diffusion barrier layer 131 that meets the requirements. In the practical application, a preparation process for the formation of the second diffusion barrier material layer 134 and the third diffusion barrier material layer 144 may be adjusted according to the requirements of the preparation cost and preparation time for the formation of the second diffusion barrier material layer 134 and the third diffusion barrier material layer 144.

It should be noted that in order to form the first diffusion barrier material layer 114 with a better conformal covering effect, the first diffusion barrier material layer 114 may be formed by using a low pressure chemical vapor deposition process or a plasma enhanced chemical vapor deposition process.

Figure 10:
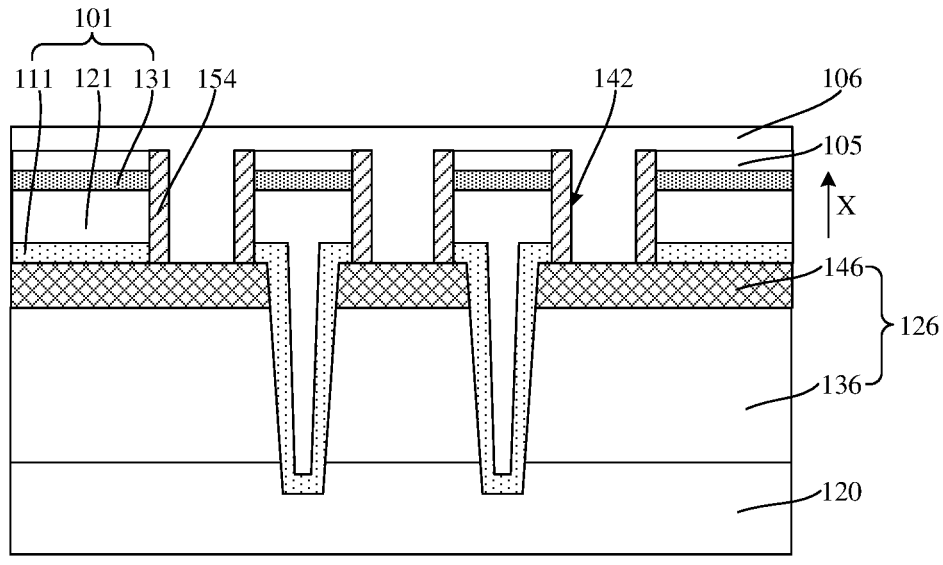
Figure 11:
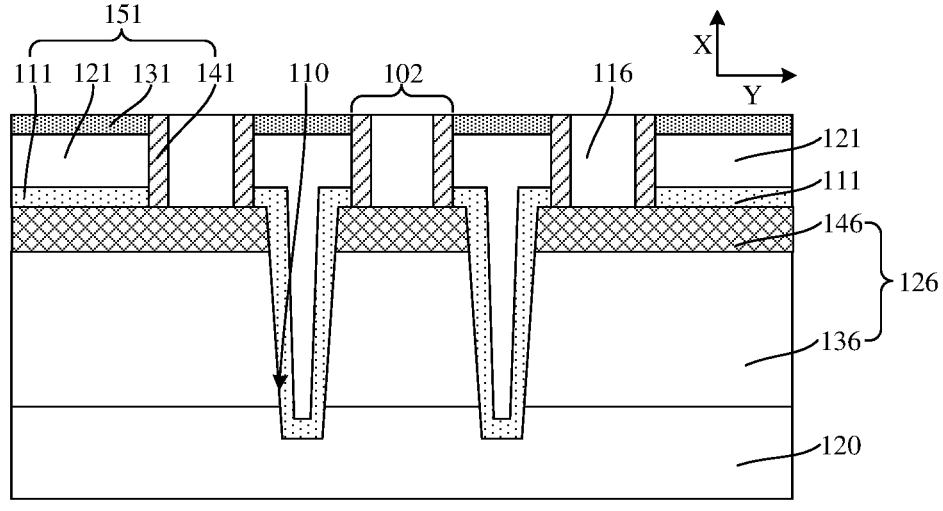

Referring to FIG. 9 to FIG. 11, the sacrificial layer 105, and the third initial diffusion barrier layer 154 located on the side wall of the sacrificial layer 105 are removed, where a remaining portion of the third initial diffusion barrier layer 154 located on the side wall of the initial contact structure 101 serves as the third diffusion barrier layer 141.

In some embodiments, the operation that the sacrificial layer 105, and the third initial diffusion barrier layer 154 located on the side wall of the sacrificial layer 105 are removed includes the following operations.

Referring to FIG. 9 and FIG. 10, a first dielectric material layer 106 is formed on the base 100, where the first dielectric material layer 106 covers the sacrificial layer 105 and the third initial diffusion barrier layer 154, and is filled in the initial groove 152 (referring to FIG. 7). It can be understood that the third groove 142 is filled with the first dielectric material layer 106, and the first dielectric material layer 106 is located on the surface of the sacrificial layer 105 which is away from the base 100.

In some embodiments, a material of the first dielectric material layer 106 is the same as a material of the sacrificial layer 105. For example, the material of the first dielectric material layer 106 and the material of the sacrificial layer 105 are silicon nitride.

In some embodiments, a material of the first dielectric material layer 106 may also be different from a material of the sacrificial layer 105. For example, the material of the first dielectric material layer 106 is silicon oxide, and the material of the sacrificial layer 105 is silicon nitride.

Referring to FIG. 10 and FIG. 11, a part of the first dielectric material layer 106, the sacrificial layer 105, and the third initial diffusion barrier layer 154 located on the side wall of the sacrificial layer 105 are removed until a top surface of the second diffusion barrier layer 131 is exposed, to form the third diffusion barrier layer 141. The second groove 132 is filled with a remaining portion of the first dielectric material layer 106, and the remaining portion of the first dielectric material layer 106 serves as a first dielectric layer 116.

It can be understood that the third diffusion barrier material layer 144 located on the side wall of the sacrificial layer 105 is removed, which is beneficial to prevent said third diffusion barrier material layer 144 from retaining in the semiconductor structure, to prevent said third diffusion barrier material layer 144 from causing the electrical interference between different target contact structures 151, or to prevent said third diffusion barrier material layer 144 from causing the damage to the electrical properties of the conductive layer 121, for example, to prevent the retaining of said third diffusion barrier material layer 144 from causing a point discharge phenomenon.

In some embodiments, the part of the first dielectric material layer 106, the sacrificial layer 105, and the third diffusion barrier material layer 144 located on the side wall of the sacrificial layer 105 may be removed by using a dry etching, to form the third diffusion barrier layer 141.

In some embodiments, the part of the first dielectric material layer 106, the sacrificial layer 105, and the third diffusion barrier material layer 144 located on the side wall of the sacrificial layer 105 may be removed by using a chemical mechanical polishing (CMP) process, to form the third diffusion barrier layer 141.

In addition, referring to FIG. 10 and FIG. 11, the sacrificial layer 105 is formed on the top surface of the second diffusion barrier layer 131 which is away from the conductive layer 121, which is beneficial to prevent the third diffusion barrier layer 141 at the junction of the third diffusion barrier layer 141 and the second diffusion barrier layer 131 from being removed. That is, when the third diffusion barrier material layer 144 is etched to form the third diffusion barrier layer 141, the third diffusion barrier material layer 144 connected with the second diffusion barrier layer 131 is retained as a part of the third diffusion barrier layer 141, which is beneficial to further improve the wrapping effect of the third diffusion barrier layer 141 on the conductive layer 121, and further prevent the diffusion of conductive elements in the conductive layer 121 to other film layers, to further ensure the good electrical properties of the conductive layer 121.

It should be noted that FIG. 1 to FIG. 5 illustrate the method for manufacturing the semiconductor structure according to an embodiment of the disclosure in which the third diffusion barrier material layer 144 is etched by using the second dielectric layer 126 as the etch stop layer. FIG. 6 to FIG. 10 illustrate the method for manufacturing the semiconductor structure according to an embodiment of the disclosure in which the third diffusion barrier material layer 144 is etched by using the sacrificial layer 105 as the etch stop layer. The finally formed semiconductor structure is shown in FIG. 11. In the practical application, in the method for manufacturing the semiconductor structure shown in FIG. 6 to FIG. 10, when the base 100 includes the second dielectric layer 126, the sacrificial layer 105 is formed on a side of the second diffusion barrier layer 131 which is away from the base 100, and the third diffusion barrier material layer 144 may be etched by using the second dielectric layer 126 as the etch stop layer according to actual requirements.

In the above various embodiments, a material of any one of the first diffusion barrier layer 111, the second diffusion barrier layer 131 and the third diffusion barrier layer 141 includes at least one of titanium nitride, tantalum nitride or tungsten nitride.

In some embodiments, a material of the first diffusion barrier layer 111, a material of the second diffusion barrier layer 131 and a material of the third diffusion barrier layer 141 are the same.

In some embodiments, a material of the conductive layer 121 includes at least one of tungsten, molybdenum, cobalt or copper.

In some embodiments, referring to FIG. 11, a thickness of the first diffusion barrier layer 111 in the first direction X is a first thickness, the thickness of the second diffusion barrier layer 131 in the first direction X is a second thickness, and a thickness of the third diffusion barrier layer 141 in the second direction Y is a third thickness. For example, the first thickness, the second thickness and the third thickness are generally the same.

In some embodiments, referring to FIG. 2, the substrate 120 includes an active area 130 and a shallow trench isolation structure 140. The contact hole 110 penetrates through the second dielectric layer 126, and is in contact with and connected with the active area 130.

It should be noted that the case where the substrate 120 includes the active area 130 and the shallow trench isolation structure 140 is applicable to the above various embodiments.

In some embodiments, referring to FIG. 2, a structure composed of the first diffusion barrier layer 111 and the conductive layer 121 located in the contact hole 110 is provided with an extension that is concave towards the active area 130. For example, each of two extensions is in contact with and connected with a respective one of different areas (for example, a source area and a drain area) of the active area 130. The second dielectric layer 126 includes the third dielectric layer 136 and the fourth dielectric layer 146 stacked onto one another. A gate dielectric layer 108 in contact with and connected with the active area 130, and a gate 118 located on a side of the gate dielectric layer 108 which is away from the active area 130 are arranged in the third dielectric layer 136. The gate dielectric layer 108 and the gate 118 together form a gate structure which is located between the two extensions.

In some embodiments, the gate 118 includes a first film layer 128, a second film layer 138 and a third film layer 148 stacked onto one another along the first direction X. In an example, a material of the first film layer 128 is polysilicon, a material of the second film layer 138 is titanium nitride, and a material of the third film layer 148 is tungsten.

In some embodiments, a first isolation layer 109, a second isolation layer 119 and a third isolation layer 129 are arranged in the third dielectric layer 136. The first isolation layer 109 is located at a top surface of the gate 118 which is away from the substrate 120, and the first isolation layer 109 is located at a side wall of the gate structure which extends along the first direction X. The second isolation layer 119 is located on a side of the first isolation layer 109 which is away from the gate structure. The third isolation layer 129 is located on a side of the second isolation layer 119 which is away from the first isolation layer 109.

It should be noted that the various examples of the third dielectric layer 136 described above are also applicable to the above various embodiments.

In summary, the surface of the conductive layer 121 which is exposed by the first groove 102 is wrapped by the first diffusion barrier layer 111, the second diffusion barrier layer 131 and the third diffusion barrier layer 141, which is beneficial to prevent the diffusion of the conductive elements in the conductive layer 121 to other film layers, which is beneficial to ensure that the conductive layer 121 has good electrical properties, which is beneficial to improve the electrical properties of the target contact structure 151, and which is beneficial to reduce the electrical interference between the different target contact structures 151. In addition, the third diffusion barrier layer 141 is also located on the side wall of the first diffusion barrier layer 111 which extends along the first direction X, and the side wall of the second diffusion barrier layer 131 which extends along the first direction X. In this way, the third diffusion barrier layer 141 is in contact with and connected with the first diffusion barrier layer 111 and the second diffusion barrier layer 131 while covering the side wall of the conductive layer 121, which is beneficial to realize the all-round wrapping effect on the conductive layer 121 by the diffusion barrier layer composed of the first diffusion barrier layer 111, the second diffusion barrier layer 131 and the third diffusion barrier layer 141, to further prevent the diffusion of the conductive elements in the conductive layer 121.

Another embodiment of the disclosure also provides a method for manufacturing a semiconductor structure, which is intended to prepare the semiconductor structure according to the above embodiments. It should be noted that the parts corresponding to or identical to the parts of the above embodiments will not be repeated herein.

Referring to FIG. 2 or FIG. 11, the semiconductor structure includes a base 100, and at least one target contact structure 151 located on the base 100. The base 100 is provided with a contact hole 110. The at least one target contact structure 151 includes a first diffusion barrier layer 111, a conductive layer 121, a second diffusion barrier layer 131 and a third diffusion barrier layer 141. The first diffusion barrier layer 111 conformably covers the contact hole 110, and the first diffusion barrier layer 111 covers a part of a top surface of the base 100. The conductive layer 121 covers the first diffusion barrier layer 111, and is filled in the contact hole 110. The second diffusion barrier layer 131 covers a top surface of the conductive layer 121. The third diffusion barrier layer 141 covers a side wall of the first diffusion barrier layer 111 located outside the contact hole 110, a side wall of the conductive layer 121 located outside the contact hole 110, and a side wall of the second diffusion barrier layer 131 located outside the contact hole 110. In some embodiments, a material of the first diffusion barrier layer 111, a material of the second diffusion barrier layer 131 and a material of the third diffusion barrier layer 141 are the same.

In some embodiments, a formation process of at least any one of the first diffusion barrier layer 111, the second diffusion barrier layer 131 and the third diffusion barrier layer 141 is different from a formation process of the others.

In some embodiments, the base 100 includes a substrate 120, and a second dielectric layer 126 located on the substrate 120. The contact hole 110 is located in the second dielectric layer 126.

In some embodiments, the second dielectric layer 126 may include a third dielectric layer 136 and a fourth dielectric layer 146 stacked onto one another along the first direction X. Herein, a material of the third dielectric layer 136 may be silicon oxide, and a material of the fourth dielectric layer 146 may be silicon nitride.

In some embodiments, the semiconductor structure may further include a first dielectric layer 116 located between adjacent target contact structures 151. It can be understood that the first groove 102 is filled with the third diffusion barrier layer 141 and the first dielectric layer 116.

In summary, a diffusion barrier layer composed of the first diffusion barrier layer 111, the second diffusion barrier layer 131 and the third diffusion barrier layer 141 wraps a surface of the conductive layer 121 which is exposed by the first groove 102, which is beneficial to prevent the diffusion of the conductive elements in the conductive layer 121 to other film layers, which is beneficial to ensure that the conductive layer 121 has good electrical properties, which is beneficial to improve the electrical properties of the target contact structure 151, and which is beneficial to reduce the electrical interference between different target contact structures 151. In addition, the third diffusion barrier layer 141 is in contact with and connected with the first diffusion barrier layer 111 and the second diffusion barrier layer 131 while covering the side wall of the conductive layer 121, which is beneficial to realize the all-round wrapping effect on the conductive layer 121 by the diffusion barrier layer composed of the first diffusion barrier layer 111, the second diffusion barrier layer 131 and the third diffusion barrier layer 141, to further prevent the diffusion of the conductive elements in the conductive layer 121.

Those skilled in the art will appreciate that the above various implementations are the specific embodiments for implementing the disclosure. In the practical application, various changes may be made to the above various implementations in terms of form and detail without departing from the spirit and scope of the embodiments of the disclosure. Any those skilled in the art may make various changes and modifications without departing from the spirit and scope of the embodiments of the disclosure. Therefore, the scope of protection of the embodiments of the disclosure shall be subject to the scope of protection of the claims.

The invention claimed is:

1. A method for manufacturing a semiconductor structure, comprising:

providing a base, the base being provided with a contact hole;

forming, on the base, an initial contact structure, and a first groove located on at least one side of the initial contact structure, wherein the initial contact structure comprises a first diffusion barrier layer, a conductive layer and a second diffusion barrier layer stacked onto one another, the first diffusion barrier layer conformably covering the contact hole and the first diffusion barrier layer covering a part of a top surface of the base, the conductive layer covering the first diffusion barrier layer and being filled in the contact hole, the second diffusion barrier layer covering a top surface of the conductive layer, the first groove exposing a side wall of the initial contact structure; and forming a third diffusion barrier layer on the side wall of the initial contact structure to obtain a target contact structure;

wherein the method for manufacturing the semiconductor structure further comprises: forming a sacrificial layer on a top surface of the initial contact structure, wherein forming the initial contact structure, the first groove located on at least one side of the initial contact structure, and the sacrificial layer comprises:

forming, on the base, a first diffusion barrier material layer, a conductive material layer, a second diffusion barrier material layer and a sacrificial material layer stacked onto one another, the first diffusion barrier material layer conformably covering the contact hole and the first diffusion barrier material layer covering the top surface of the base, the conductive material layer covering the first diffusion barrier material layer and being filled in a remaining portion of the contact hole, the second diffusion barrier material layer covering the conductive material layer, the sacrificial material layer covering the second diffusion barrier material layer; and patterning the first diffusion barrier material layer, the conductive material layer, the second diffusion barrier material layer and the sacrificial material layer to form the initial contact structure, the sacrificial layer, and an initial groove, the initial groove exposing the side wall of the initial contact structure and a side wall of the sacrificial layer, the initial groove comprising the first groove;

wherein forming the third diffusion barrier layer on the side wall of the initial contact structure comprises:

forming a third diffusion barrier material layer, the third diffusion barrier material layer conformably covering the initial groove and the third diffusion barrier material layer covering a top surface of the sacrificial layer;

etching back the third diffusion barrier material layer to form a third initial diffusion barrier layer located on the side wall of the initial contact structure and the side wall of the sacrificial layer; and removing the sacrificial layer, and the third initial diffusion barrier layer located on the side wall of the sacrificial layer, a remaining portion of the third initial diffusion barrier layer located on the side wall of the initial contact structure serving as the third diffusion barrier layer.

2. The method for manufacturing the semiconductor structure of claim 1, wherein removing the sacrificial layer, and the third initial diffusion barrier layer located on the side wall of the sacrificial layer comprises:

forming a first dielectric material layer on the base, the first dielectric material layer covering the sacrificial layer and the third initial diffusion barrier layer, and the first dielectric material layer being filled in the initial groove; and removing a part of the first dielectric material layer, the sacrificial layer, and the third initial diffusion barrier layer located on the side wall of the sacrificial layer until a top surface of the second diffusion barrier layer is exposed.

3. The method for manufacturing the semiconductor structure of claim 2, wherein a material of the first dielectric material layer is the same as a material of the sacrificial layer.

4. The method for manufacturing the semiconductor structure of claim 1, wherein a thickness of the second diffusion barrier material layer is equal to a thickness of the third diffusion barrier material layer.

5. The method for manufacturing the semiconductor structure of claim 1, wherein the base comprises a substrate, and a second dielectric layer located on the substrate, and the contact hole is located in the second dielectric layer.

6. The method for manufacturing the semiconductor structure of claim 1, wherein a material of any one of the first diffusion barrier layer, the second diffusion barrier layer and the third diffusion barrier layer comprises at least one of titanium nitride, tantalum nitride or tungsten nitride.

7. The method for manufacturing the semiconductor structure of claim 1, wherein a material of the first diffusion barrier layer, a material of the second diffusion barrier layer and a material of the third diffusion barrier layer are the same.

8. The method for manufacturing the semiconductor structure of claim 1, wherein a material of the conductive layer comprises at least one of tungsten, molybdenum, cobalt or copper.

* * * * *